United States Patent

Young et al.

[11] Patent Number: 6,046,479
[45] Date of Patent: Apr. 4, 2000

[54] ELECTRONIC DEVICES COMPRISING THIN-FILM TRANSISTORS

[75] Inventors: Nigel D. Young, Redhill; John R. A. Ayres, Reigate; Martin J. Edwards, Crawley, all of United Kingdom

[73] Assignee: U.S. Philips Corporation, New York, N.Y.

[21] Appl. No.: 09/274,389

[22] Filed: Mar. 23, 1999

[30] Foreign Application Priority Data

Mar. 28, 1999 [GB] United Kingdom ............... 9806609

[51] Int. Cl.[7] ................... H01L 27/01; H01L 27/12; H01L 31/0392; H01L 23/58
[52] U.S. Cl. ................... 257/350; 257/353; 257/488; 257/489
[58] Field of Search .................... 257/60, 66, 347, 257/349, 350, 352, 353, 354, 488, 489

[56] References Cited

U.S. PATENT DOCUMENTS

| | | | |
|---|---|---|---|
| 5,130,829 | 7/1992 | Shannon | 359/59 |
| 5,477,073 | 12/1995 | Wakai et al. | 257/347 |
| 5,572,046 | 11/1996 | Takemura | 257/66 |
| 5,712,495 | 1/1998 | Suzawa | 257/51 |
| 5,818,070 | 10/1998 | Yamazaki et al. | 257/72 |
| 5,977,559 | 11/1999 | Zhang et al. | 257/57 |

FOREIGN PATENT DOCUMENTS

| | | | |
|---|---|---|---|
| 0629003A1 | 12/1994 | European Pat. Off. | H01L 29/784 |
| 09045931A | 2/1997 | Japan | H01L 29/786 |

OTHER PUBLICATIONS

"Characteristics of Offset–Structure Polycrystalline–Silicon Thin–Film Transistors" by Keiji Tanaka et al., in IEEE Electron Devices Letters vol. 9, No. 1, Jan. 1988.

"Influence of Drain Field on Poly–Si TFT Behaviour" by J.R. Ayres et al, In the Proceedings of the Active Matrix Workshop published by SID—The Society for Information Display.

"WS 3/1: Influence of Drain Field on Poly–Si TFT Behaviour" by J.r. Ayres and S.D Brotherton, in Proceedings of the 1996 International Active Matrix Workshop, vol., Sep. 1996, pp. 33–36.

Primary Examiner—Ngân V. Ngô
Attorney, Agent, or Firm—John C. Fox

[57] ABSTRACT

A large-area electronic device, such as an AMLCD, has switching TFTs ($T_p$) in a matrix and circuit TFTs ($T_s$) in a peripheral drive circuit. Both the TFTs ($T_p$, $T_s$) comprise a field-relief region (130) which has a lower doping concentration (N–) than their drain region (113) and which is present between their channel region (111) and the drain region (113). This field-relief region (130), at least over most of its length, overlaps with the gate (121) in the circuit TFTs ($T_s$) so as to reduce series resistance in the field-relief region (130) by conductivity modulation with the gate (121). However, the drain region (113) in the switching TFTs ($T_p$) is offset from overlap with their gate (121) by at least most of the length of their field-relief region (130). This field-relief offset permits the switching TFTs ($T_p$) to have a lower leakage current than the circuit TFTs ($T_s$).

10 Claims, 3 Drawing Sheets

ELECTRONIC DEVICES COMPRISING THIN-FILM TRANSISTORS

BACKGROUND OF THE INVENTION

This invention relates to electronic devices including thin-film transistors (hereinafter termed "TFTs") on a substrate, for example a glass or insulating polymer substrate. The device may be, for example, an active-matrix liquid-crystal display or other flat panel display, or any other type of large area electronic device with TFTs in a matrix and in a drive circuit, for example, a thin-film data store or an image sensor. The invention also relates to methods of manufacturing such an electronic device.

For many years there has been much interest in developing thin-film circuits with TFTs on glass and/or on other inexpensive insulating substrates, for large area electronics applications. Such TFTs fabricated with amorphous or polycrystalline semiconductor films may form the switching elements of a cell matrix, for example, in a flat panel display as described in U.S. Pat. No. 5,130,829 (Our Ref: PHB 33646). A more recent development involves the fabrication and integration of circuits from TFTs (often using polycrystalline silicon) as, for example, integrated drive circuits for such a cell matrix. Thus, for example, published European Patent Application EP-A-0 629 003 (corresponding U.S. patent application Ser. No. 08/639277: Our Ref: PHB 33845) describes such an electronic device comprising on a substrate a switching matrix of thin-film switching transistors and a peripheral drive circuit located outside the matrix and comprising thin-film circuit transistors which are coupled to the switching TFTs of the matrix. The whole contents of U.S. Pat. No. 5,130,829 and EP-A-0 629 003 are hereby incorporated herein as reference material.

Unfortunately, undesirable field-induced effects occur in the transistor characteristics of such TFTs, especially those fabricated with polycrystalline silicon formed using low temperature processes. Several instability mechanisms occur, for example, bias-induced state creation in the polycrystalline silicon, and hot carrier induced state creation and carrier trapping. Another effect which occurs is a drain field-enhanced increase in leakage current. The degradation of the transistor characteristics (for example, off-state leakage current, threshold voltage and on-state current) can seriously limit the use of such TFTs in such circuits.

One way of reducing such effects in TFTs is by means of a field-relief region having a lower doping concentration of the one conductivity type than the drain region. The TFT comprises an insulated gate adjacent to a crystalline semiconductor film for controlling a conduction channel of one conductivity type in the semiconductor film between source and drain regions of the one conductivity type. The field relief region is present between the conduction channel and drain region of the TFT.

The article "Characteristics of Offset-Structure Polycrystalline-Silicon Thin-Film Transistors" by K. Tanaka et al. in IEEE Electron Devices Letters Vol. 9 No. 1, January 1988, describes one form of such a TFT wherein the drain region is offset from the gate by at least most of the field relief region. The resulting TFT has a reduced leakage current, as compared with a non-offset TFT structure without any field-relief region. The paper WS3/1 "Influence of Drain Field on Poly-Si TFT Behaviour" by J. R. Ayres et al. in the Proceedings of the Active Matrix Workshop (published by SID—The Society for Information Display) held with the 16th International Display Research Conference, Birmingham England, Sep. 30, 1996, discloses another form wherein at least most of the field relief region overlaps with the gate. The whole contents of this article and this paper are hereby incorporated herein as reference material.

OBJECTS AND SUMMARY OF THE INVENTION

It is an aim of the present invention to optimise (or at least to improve) the TFT operating characteristics in both the switching matrix and peripheral drive circuit of such flat panel displays and other electronic devices.

According to the present invention there is provided an electronic device as set out in claim 1. In this device at least most of the field relief region overlaps with the gate in at least some of the circuit TFTs of the peripheral drive circuit, so as to reduce series resistance in their field relief region by conductivity modulation with the gate; whereas the drain region in the switching TFTs of the matrix is offset from overlap with the gate by at least most of their field relief region so as to provide the switching TFTs with a lower leakage current than the circuit TFTs with gate overlap. This advantageous mixture of gate-overlap and gate-offset TFTs with field relief regions permits the switching TFTs of the matrix to provide a low leakage for pixels (or other matrix cell types) in the off-state and to be stable at high drain bias, while permitting circuit TFTs of the drive circuit to have low series resistance in the on-state and to be stable at high drain bias. The gate-overlap TFT structure with low series resistance is particularly advantageous for circuit TFTs which transmit analog signals, for example sampling TFTs in sample-and-hold functions in the drive circuit.

Furthermore, the circuit TFTs of the peripheral drive circuit and the switching TFTs of the matrix may be fabricated using the same process steps and masks, at least when the regions of one type or both types of the TFTs are not defined in a self-aligned manner with respect to their gates. Different element layout geometries for (for example) the gate mask pattern and/or doping pattern can be used in the matrix area (to provide the gate-offset TFTs), as compared with the peripheral drive circuit area (to provide gate-overlap TFTs). Thus, for example, the source and drain regions of the gate-offset switching TFTs may have the same doping concentration as the source and drain regions of the circuit TFTs with gate overlap. The field relief regions of the gate-offset switching TFTs (when not self aligned with their gate) may, for example, have the same doping concentration as the field relief regions of the circuit TFTs with gate overlap. Some of the TFTs fabricated in the peripheral drive circuit (for example using the same process steps and masks) may be provided without gate overlap and/or without a field relief region when these features are not needed nor desirable in terms of the circuit functions of these particular circuit TFTs.

The TFTs of the peripheral drive circuit and of the switching matrix may be fabricated using known technologies and process steps. Thus, for example, the TFTs may be both of top-gate configuration or of bottom-gate configuration. The source and drain regions and field-relief region may be doped regions of the one conductivity type present in the semiconductor film, and/or they may be doped regions of one or more additional semiconductor films adjacent to the said semiconductor film. Gate-aligned processes may be used in order to reduce parasitic effects. Thus, for example, at least some of the circuit TFTs may have their field relief region substantially entirely overlapping with the gate, and the gate of these TFTs and/or of other circuit TFTs may have an edge which is substantially aligned with an edge of the drain region.

BRIEF DESCRIPTION OF THE HEADING

These and other features of the present invention, and their advantages, are illustrated specifically in embodiments of the invention now to be described, by way of example, with reference to the accompanying diagrammatic drawings, in which.

Figure 1:
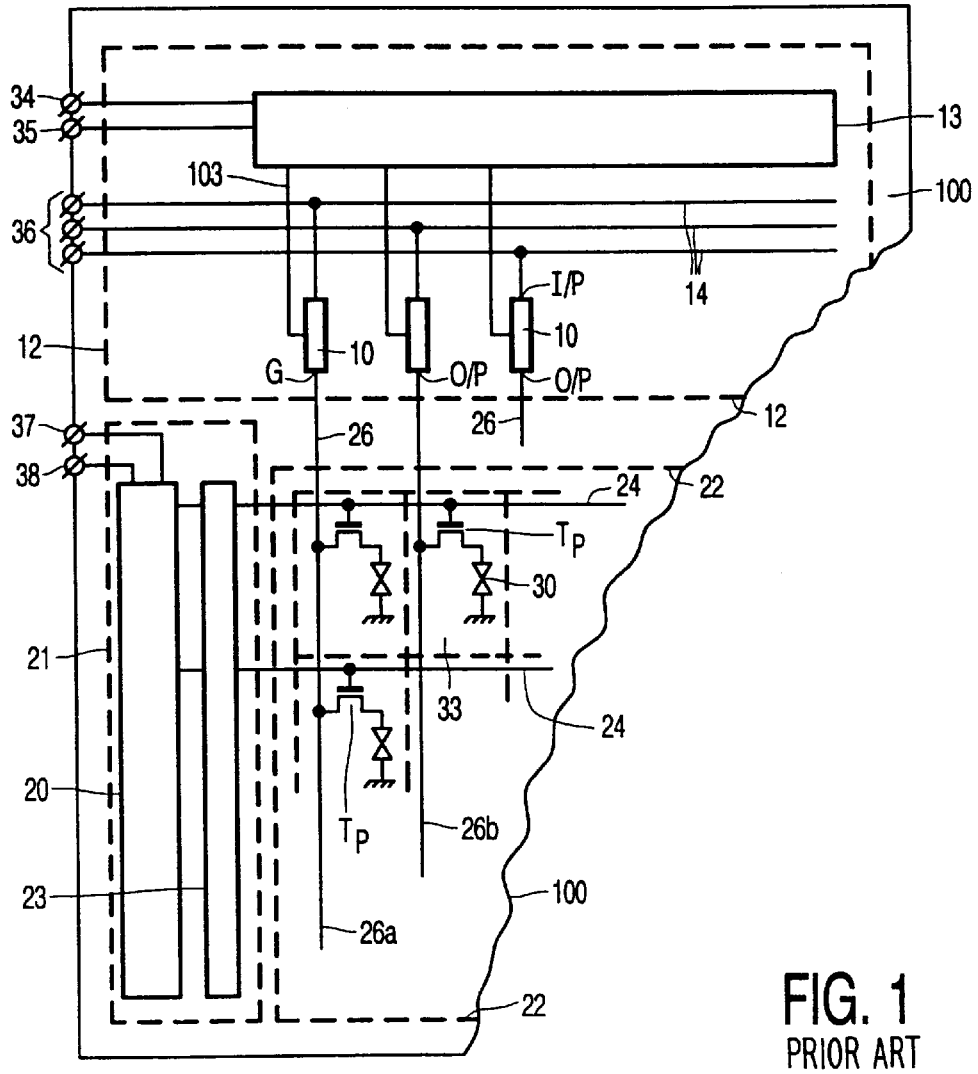
FIG. 1 is a circuit diagram (partly in block form) of a large area electronic device (such as a flat panel display) comprising on a substrate a switching matrix and a peripheral drive circuit.
Figure 4:
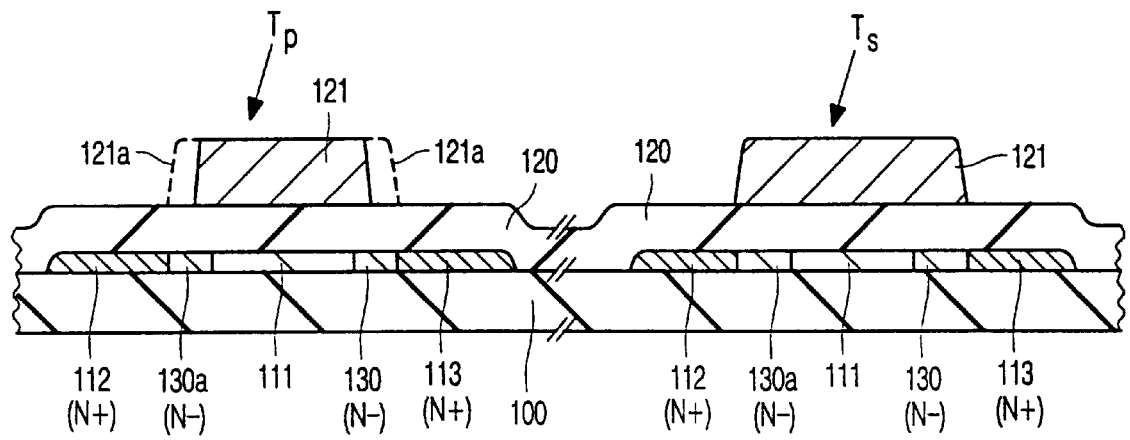
Figure 7:
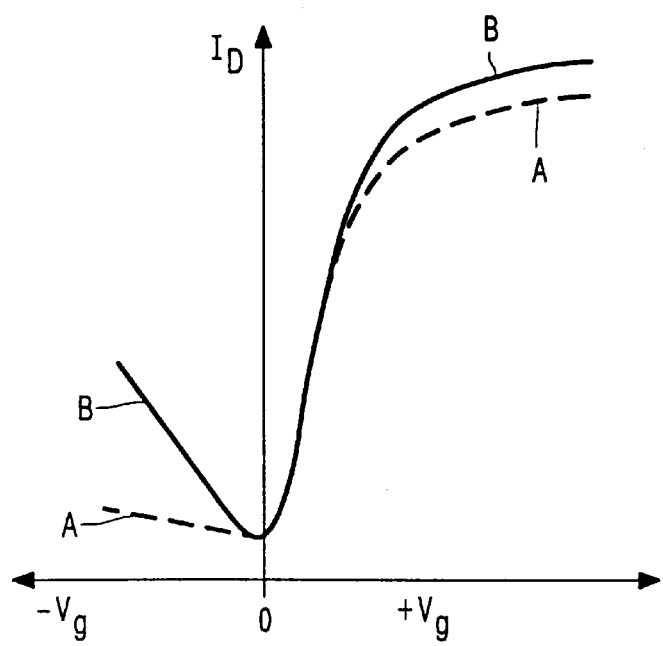
Figure 8:
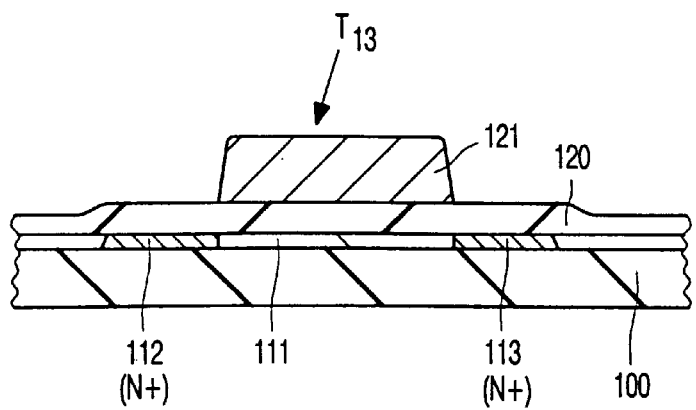

FIG. 7 is a typical comparative plot of drain current $I_D$ against gate voltage $V_g$, for gate-offset field-relief TFTs (curve A) of the switching matrix and gate-overlap field-relief TFTs (curve B) of the peripheral drive circuit; and FIG. 8 is a cross-sectional view of another type of TFT structure which may be used in a part of the peripheral drive circuit of FIG. 1, for example together with the FIG. 4 matrix and circuit TFTs in a device in accordance with the invention.

It should be noted that the drawings are diagrammatic. Relative dimensions and proportions of parts of the cross-section views and circuit layout have been shown exaggerated or reduced in size for the sake of clarity and convenience in the drawings. The same reference signs are generally used to refer to corresponding or similar features in the different embodiments.

DESCRIPTION OF THE PREFERRED EMBODIMENTS

Apart from the formation of its switching and circuit TFTs in accordance with the present invention, the electronic device may be of known type and construction. Thus, by way of a specific example, The device illustrated in FIGS. 1 and 2 may be similar to the active matrix liquid crystal display (AMLCD) panel of EP-A-0 629 003. Indeed these Figures are derived from FIGS. 1 and 2 of EP-A-0 629 003, corresponding and similar features being indicated by the same reference signs as in EP-A-0 629 003. Thus, only a brief overview of this device is now given before focusing on specific characteristic features of the present invention, and the reader is directed to the disclosure in EP-A-0 629 003 (and the background in U.S. Pat. No. 5,130,829) for more details of this type of device.

In the FIG. 1 device an electrically insulating substrate 100 carries a switching matrix 22 of switching TFTs $T_P$ and also carries peripheral drive circuits 12,21 which are located outside the matrix 22 and which comprise switching TFTs, for example $T_S$ and $T_2$ which are coupled directly or indirectly to the switching TFTs $T_P$ of the matrix. In the present description and drawings, the switching TFTs are designated $T_P$, rather than 29 as in EP-A-0 629 003. The matrix 22 comprises cells 33 (for example, pixel cells of a liquid-crystal display) organised in rows and columns. The substrate 100 may be, for example, a glass back panel of the display. The matrix 22 has thin-film row lines 24 connected to a row drive circuit 21 for addressing rows of the matrix 22. The matrix 22 also has thin film column lines 26 connected to a column drive circuit 12 for supplying sampled signals to cells 33 in the addressed row. These lines 24 and 26 and drive circuits 12 and 21 are integrated in thin-film technology on the same substrate 100 as the matrix 22.

FIGS. 3 to 6 illustrate specific examples of thin-film transistor structures for the switching TFTs $T_P$ of the matrix 22 and for the circuit TFTs $T_S$ of the drive circuit 12. The TFTs $T_P$ and $T_S$ each comprise an insulated gate 121 adjacent to a transistor body 110 of a crystalline semiconductor film. The semiconductor film is typically of polycrystalline silicon. The gate 121 is coupled to the body 110 across a gate dielectric film 120 so as to control a conduction channel of one conductivity type in a region 111 of the semiconductor film between source and drain regions 112 and 113, respectively, also of the one conductivity type. Typically the TFTs $T_P$ and $T_S$ are N-channel, the source and drain regions 112 and 113 being of the N-type conductivity. Typically the polysilicon film may have a thickness of about 40 nm and has no deliberate doping in the region 111. The region 111 is effectively intrinsic in conductivity or very slightly n-type in some polycrystalline forms. Its conductivity state is determined by the high density of trapping states in the polycrystalline film. These trapping states result in the Fermi level being pinned near the middle of the energy band gap. The source and drain regions 112 and 113 are highly doped with, for example, phosphorus or arsenic, and so are designated N+ in FIGS. 3 to 6. Typically the doping level in the source and drain regions 112 and 113 may be, for example, $10^{16}$ cm$^{-2}$ or more.

Both the TFTs $T_P$ and $T_S$ also comprise a field-relief region 130 which has a lower doping concentration (designated N−) of the one conductivity type than the drain region 113 and which is present between the channel region 111 and the drain region 113. Typically the doping level of the field-relief region 130 is less than $5 \times 10^{13}$ cm$^{-2}$, and may be of the order of $10^{12}$ cm$^{-2}$. In accordance with the present invention, the field-relief region 130 (at least over most of its length) overlaps with the gate 121 in the circuit TFTs $T_S$ so as to reduce series resistance in the field-relief region 130 by conductivity modulation with the gate 121, whereas the drain region 113 in the switching TFTs $T_P$ is offset from overlap with their gate 121 by at least most of the length of their field-relief region 130. The field-relief offset in accordance with the present invention permits these switching TFTs $T_P$ to have a lower leakage current than the circuit TFTs $T_S$.

In this description, the expression "gate-overlap TFTs" is used for TFTs in which at least most of the field-relief region 130 overlaps with the gate 121, whereas the expression "gate-offset TFTs" is used for TFTs in which the drain region 113 is offset from overlap with the gate 121 by the field-relief region 130. The optimum length of the field-relief region 130 for both the gate-offset TFTs $T_P$ and the gate-overlap TFTs $T_S$ depends, inter alia, on the length of the channel region 111, the gate and maximum drain operating voltages, the current levels through the TFT, and whether various regions are formed with self-aligned techniques. In a typical specific example, the length of the field-relief 10 region 130 may be in the range of about 1 μm (micrometer) to 3 μm in TFTs $T_P$ and $T_S$ which are fabricated with present day technology for an AMLCD and which have a length in the range of 5 μm to 10 μm for their channel region 111. When regions are self-aligned with the gate, then the length of the field-relief region may be typically about 1 μm or less. The source and drain regions 112 and 112 of the gate-offset switching TFTs $T_P$ may have the same doping concentration as the source and drain regions of the gate-overlap circuit TFTs $T_S$. The field-relief regions of the gate-offset switching TFTs $T_P$ may also have the same doping concentration (or at least the same order of magnitude) as the field-relief regions of the gate-overlap circuit TFTs $T_S$.

Figure 2:
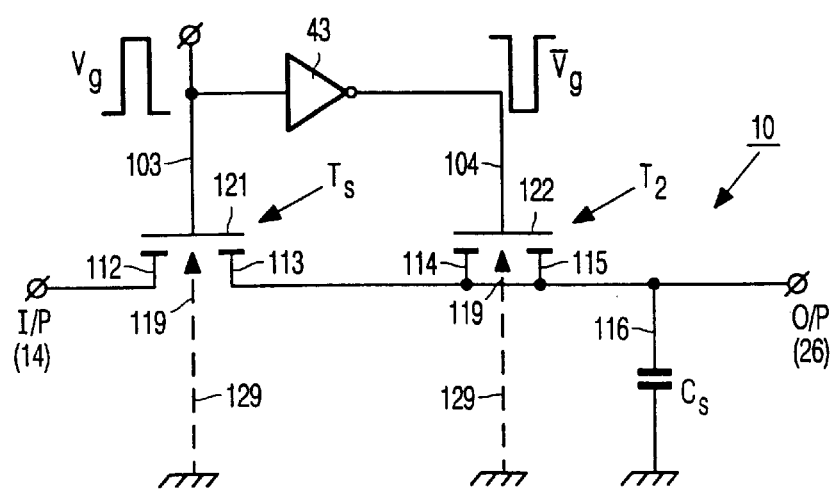
FIG. 2 is a circuit diagram of a sample-and-hold circuit in the drive circuit of the device of FIG. 1.

The drive circuit 12 for the column lines 26 comprises a shift register 13 which addresses sequentially individual sample-and-hold circuits 10 for each column line 26. The present invention permits the provision of a high performance individual sample-and-hold circuit 10 for each column line 26, by constructing the circuit 10 with gate-overlap TFTs $T_S$ and $T_2$. Depending upon 25 the capacitance of the column line 26, each circuit 10 may include a discrete storage capacitor $C_S$ (as illustrated in FIG. 2) or the capacitance of the line 26 itself may provide the charge-storage means of the sample-and-hold circuit 10. FIG. 2 shows the same circuit configuration for the circuit 10 as in EP-A-0 629 003. Thus, the circuit 10 may additionally comprise a compensating TFT $T_2$ which is of a similar TFT structure to the sampling transistor $T_S$. These TFTs $T_S$ and $T_2$ may each additionally comprise a minority-carrier injector 119 in accordance with the teaching in EP-A-0 629 003. However, the circuit 10 may be constructed without the compensating TFT $T_2$; and instead of incorporating such an injector 119, a similar effect can be achieved by coupling a P-channel TFT in parallel with this N-channel TFT $T_S$. No injector 119 (and no compensating TFT $T_2$) is shown in FIGS. 3 to 6.

FIG. 7 shows typical comparative characteristics for a gate-offset TFT (curve A) and a gate-overlap TFT (curve B) in both the on-state and the off-state. In the on-state (positive Vg for N-channel TFTs) the gate-overlap TFT has a lower series resistance and so passes a higher drain current for a given gate voltage value Vg. Thus, a gate-overlap TFT structure (instead of a gate-offset TFT structure) is beneficial for the transmission TFTs $T_S$ (and T2) in the circuit 10 for fast charging of the capacitor $C_S$ to the analog video input signal. In the off-state (negative Vg for N-channel TFTs), the gate-offset TFT has a lower leakage current as shown by curve A. Thus, the use of a gate-offset TFT structure (instead of a gate-overlap TFT structure) is beneficial for the pixel switching TFTs $T_P$ of the matrix 22. The magnitude of the different values of on-state current and leakage current for curves A and B depends on the particular TFT configurations (FIGS. 3 to 6) adopted for $T_P$ and $T_S$ and on their region dimensions. By way of example, the difference in on-state current between curves A and B may be a factor of two, for example at Vg of +15 volts, whereas the difference in the field-induced increase of leakage current between curves A and B may be an order of magnitude (i.e. a factor of ten, or more), for example at $V_g$ of −10 volts. The Applicants find that the series resistance of the gate-offset field-relief region 130 is not a significant problem for the switching TFTs $T_P$ of the matrix 22, but it would be a problem for the transmission TFTs $T_S$ of the circuit 10. Both the gate-offset TFTs $T_P$ and the gate-overlap TFTs $T_S$ have good stability at high drain bias, due to the presence of their respective field-relief regions 130.

Figure 3:
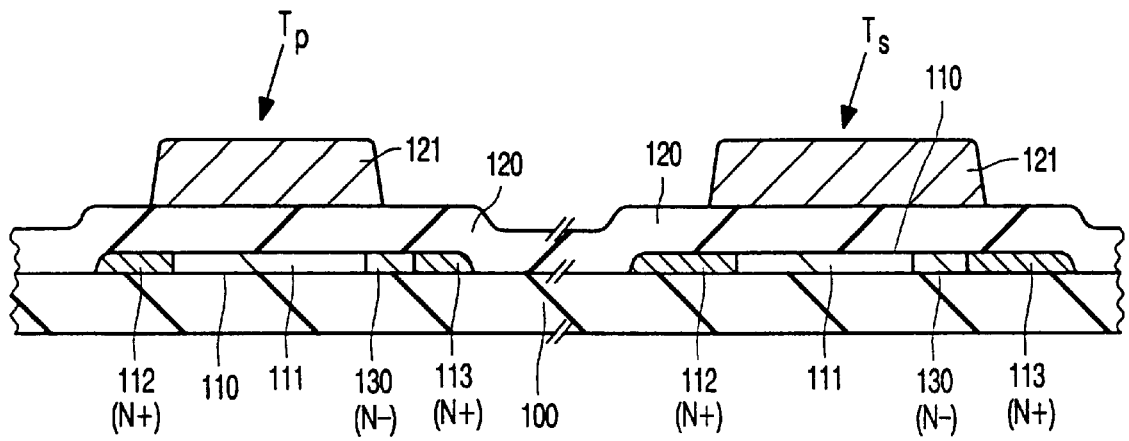
FIGS. 3 to 6 are cross-sectional views of a variety of TFT structures which may be used in such a device in accordance with the invention, in which the left-hand section of each drawing relates to the switching matrix and the right-hand section relates to the peripheral drive circuit.

Both the gate-offset TFT $T_P$ and the gate-overlap TFT $T_S$ may be fabricated using many common process steps and masks, but with different element layout geometries. Known technologies and processes may be used. Thus, for example, both FIGS. 3 and 4 illustrate top-gate configurations for the TFTs $T_P$ and $T_S$. In this case the gate 121 of both TFTs $T_P$ and $T_S$ is provided on a gate-dielectric film 120 on the semiconductor film of the transistor body 110.

FIG. 3 illustrates an embodiment in which there is a slight overlap between the gate 121 of $T_S$ and its source and drain regions 112 and 113 and a slight overlap between the gate 121 of $T_P$ and its source 112 and field-relief region 130. Thus, these TFTs do not have a self-aligned structure. In this case, the source and drain regions 112 and 113 and the respective field-relief regions 130 can be implanted in the semiconductor film of the transistor body 110, before the insulated gate structure 120,121 is provided on the semiconductor film.

FIG. 4 illustrates a modified embodiment with symmetrical TFT structures, each of which has similar low-doped regions at both its source and drain ends of the channel region 111. Thus, in the FIG. 4 embodiment, additional field-relief regions 130a are present between the source region 112 and channel region 111 of each TFT $T_P$ and $T_S$. In this case the gate-overlap TFT $T_S$ has symmetrical characteristics between its source and drain, and so too does the gate-offset TFT $T_P$. The TFTs $T_S$ have their field-relief region 130 substantially entirely overlapping with the gate 121, and the gate 121 has an edge substantially aligned with an edge of the drain region 113. This TFT structure for $T_S$ has a reduced gate-drain capacitance. The gate-source capacitance is also reduced by the edge of the source region 112 being substantially aligned with the edge of the gate 121. A similar self-aligned structure is first formed for the TFT $T_P$ of FIG. 4, except in this case the field-relief regions 130 and 130a have their source and drain edges subsequently offset from the edges of the gate 121 by etching back these edges of the gate 121 (as illustrated by the broken outline 121a in in FIG. 4). This etch back can be carried out while masking the matrix 22.

Figure 5:
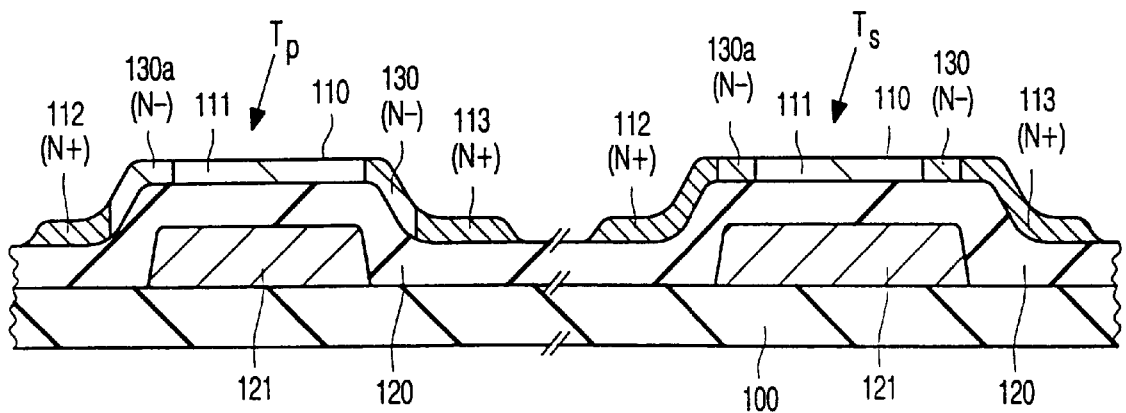

FIG. 5 illustrates a symmetrical TFT arrangement, but in a bottom-gate configuration for the TFTs $T_P$ and $T_S$. In this case, the semiconductor film which provides the transistor body 110 is present on a gate-dielectric film 120 which extends over the gate 121 on the substrate 100. In the FIG. 5 embodiment, the field-relief regions 130 and 130a and the source and drain regions 112 and 113 of each TFT $T_P$ and $T_S$ are implanted in the semiconductor film deposited on the insulated gate structure 120,121.

Figure 6:
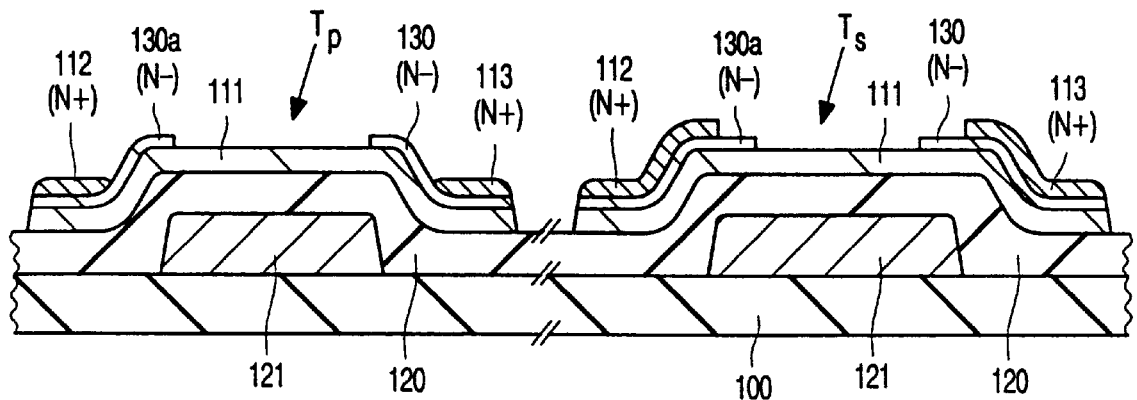

In the embodiments of FIGS. 3 to 5 the source and drain regions 112 and 113 and field-relief region 130 are doped regions of one conductivity type present in the same semiconductor film. FIG. 6 illustrates an embodiment in which the source and drain regions 112 and 113 and the field relief region 130 are doped regions of additional semiconductor films adjacent to the semiconductor film which provides the channel region 111. By way of example, this multiple semiconductor film embodiment is shown as a modification of the bottom-gate configuration of FIG. 5. In this example the field-relief regions 130 (and 130a) are formed from a lightly doped N-type semiconductor film deposited on the undoped semiconductor film which provides the channel region 111. The source and drain regions 112 and 113 are formed from a highly doped N-type semiconductor film which is deposited on the lightly doped film. The lateral extent of the source and drain regions 112 and 113 and the field-relief regions 130 (and 130a) are defined using known photolithographic and etching techniques.

The gate-overlap TFT structures illustrated in FIGS. 3 to 6 are particularly advantageous for transistors such as $T_S$ and $T_2$ which transmit analog signals in the drive circuit. Most of the TFTs of other parts 13, 20 and 23 of the peripheral drive circuits are digital switching transistors. These other TFTs may be fabricated with a gate-overlap structure similar to that of $T_S$ or even (if series resistance is less problematic) a gate-offset structure similar to that of $T_P$ for some of these other circuit TFTs. Furthermore the transistor structure T13 of FIG. 8 may be used for circuit TFTs requiring only a low voltage operation. The TFT T13 of FIG. 8 has no field-relief region 130, and its source and drain regions 112 and 113 have their channel edges aligned with the edges of the gate 121, so providing a fast switching characteristic. FIG. 8 illustrates an N-channel TFT structure compatible with the TFT structures of FIG. 4. The circuit blocks 13, 20 and 23 may be formed entirely with N-channel TFTs, or they may be formed with complementary P-channel and N-channel TFTs.

In the switching TFT $T_P$ of FIG. 4, the regions 130a and 130 are formed in the same doping step as the regions 130a and 130 of the circuit TFT $T_S$. However, the regions 130 (and optional regions 130a) of switching TFTs $T_P$ may be formed in a later doping step from the regions 130 (and optional regions 130a) of the circuit TFT $T_S$. Thus, for example, the regions 130 of TFTs $T_S$ may first be implanted, and then the source and drain regions of both TFTs $T_S$ and $T_P$ may be implanted using the gate electrodes 121 as masks so as to be self-aligned with the gate electrodes 121. The gate electrodes 121 of TFTs $T_P$ can then be etched back (for example as in FIG. 4), and then the regions 130 and 130a of these TFTs $T_P$ can be implanted using their gate electrodes 121 as masks so as to be self-aligned with the gate electrodes 121.

FIG. 1 illustrates a flat panel display. The present invention may be employed with other matrix devices which are designed for a quite different function, for example a data store having a matrix of TFTs $T_P$ for addressing an array of thin-film data storage elements (for example thin-film capacitors or memory-type TFTs). In this different type of device in accordance with the present invention, the matrix TFTs $T_P$ have a gate-offset field-relief structure whereas at least some of the circuit TFTs $T_S$ have a gate-overlap field-relief structure, for example with TFT structures as in FIGS. 3 to 6. Such gate-offset and gate-overlap TFT structures may be used in accordance with the present invention in another form of matrix device, for example an image sensor having a matrix 22 of cells 33 each comprising a thin-film image-sensing element (for example a photodiode) addressed by a gate-offset TFT $T_P$ via row lines 24. The TFTs $T_P$ (which switch each imaging pixel 33) may have a transistor structure as illustrated in the left hand section of FIGS. 3 to 6. The photodiode signal may be output to peripheral sensing circuitry 13' of the image sensor, via a sample-and-hold circuit 10' which acts as an integrator for a signal. Such a circuit 10' for an image sensor may be constructed with a gate-overlap TFT $T_S$, for example as illustrated in the right hand sections of FIGS. 3 to 6.

From reading the present disclosure, other variations and modifications will be apparent to persons skilled in the art. Such variations and modifications may involve equivalent and other features which are already known in the design, manufacture and use of electronic devices comprising TFTs and other semiconductor devices and component parts thereof and which may be used instead of or in addition to features already described herein.

Although claims have been formulated in this Application to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention. Although the dependency of subsidiary claims has been limited in the interests of meeting the requirements and reducing the fees for multiple-claim-dependency in some countries, it should be understood that technical features included in any one claim may be used in combination with technical features of any one of the other claims. Particularly, but not exclusively, the following combinations are potentially important: features of claim 4 may be used in combination with any one of the claims 1 to 3; and features of claims 7, 8 and 9 may be used in combination with any one of the claims dependent on claim 1.

The Applicants hereby give notice that new claims may be formulated to any such features and/or combinations of such features during the prosecution of the present Application or of any further Application derived therefrom.

We claim:

1. An electronic device comprising on a substrate a switching matrix of thin-film switching transistors and a peripheral drive circuit comprising thin-film circuit transistors which are coupled to the switching transistors of the matrix, wherein the thin-film switching transistors and circuit transistors both comprise an insulated gate adjacent to a crystalline semiconductor film for controlling a conduction channel of one conductivity type in the semiconductor film between source and drain regions of the one conductivity type, a field-relief region having a lower doping concentration of the one conductivity type than the drain region being present between the conduction channel and the drain region, and wherein at least most of the field relief region overlaps with the gate in at least some of the circuit transistors so as to reduce series resistance in the field relief region by conductivity modulation with the gate, and wherein the drain region in the switching transistors of the matrix is offset from overlap with the gate by at least most of the field relief region so as to provide the switching transistors with a lower leakage current than the circuit transistors with gate overlap.

2. A device as claimed in claim 1, wherein the thin-film switching transistors and circuit transistors are both of top-gate configuration having their gate on a gate-dielectric film on the said semiconductor film.

3. A device as claimed in claim 1, wherein the thin-film switching transistors and circuit transistors are both of bottom-gate configuration having their semiconductor film on a gate-dielectric film which is present over the gate on the substrate.

4. A device as claimed in claim 1, wherein the source and drain regions of the switching transistors have the same doping concentration as the source and drain regions of the circuit transistors with gate overlap.

5. A device as claimed in claim 4, wherein the source and drain regions and field-relief region are doped regions of the one conductivity type present in the semiconductor film.

6. A device as claimed in claim 4, wherein the source and drain regions and field-relief region are doped regions of one or more additional semiconductor films adjacent to the said semiconductor film.

7. A device as claimed in claim 4, wherein the field relief regions of the switching transistors have the same doping concentration as the field relief regions of the circuit transistors with gate overlap.

8. A device as claimed in claim 1, wherein at least some of the circuit transistors have their field relief region substantially entirely overlapping with the gate which has an edge substantially aligned with an edge of the drain region.

9. A device as claimed in claim 1, wherein at least some of the circuit transistors with gate overlap are transmitting transistors which transmit analog signals in the drive circuit.

10. A device as claimed in claim 9, wherein at least some of the transmitting transistors with gate overlap are sampling transistors in sample-and-hold circuits and have charge-storage means coupled to their drain region for storing the analog signals.

* * * * *